United States Patent
Goux et al.

(10) Patent No.: US 8,310,857 B2
(45) Date of Patent: Nov. 13, 2012

(54) METHOD FOR MANUFACTURING A RESISTIVE SWITCHING MEMORY CELL COMPRISING A NICKEL OXIDE LAYER OPERABLE AT LOW-POWER AND MEMORY CELLS OBTAINED THEREOF

(75) Inventors: Ludovic Goux, Hannut (BE); Judit Lisoni Reyes, Oud-Heverlee (BE); Dirk Wouters, Leuven (BE)

(73) Assignee: IMEC, Leuven (BE)

( * ) Notice: Subject to any disclaimer, the term of this patent is extended or adjusted under 35 U.S.C. 154(b) by 192 days.

(21) Appl. No.: 12/792,332

(22) Filed: Jun. 2, 2010

(65) Prior Publication Data
US 2011/0044089 A1 Feb. 24, 2011

Related U.S. Application Data

(60) Provisional application No. 61/183,226, filed on Jun. 2, 2009.

(51) Int. Cl.
*G11C 11/00* (2006.01)
*H01L 29/02* (2006.01)
*H01L 47/00* (2006.01)

(52) U.S. Cl. ............... 365/148; 365/163; 257/2; 257/4
(58) Field of Classification Search ................... 365/148
See application file for complete search history.

(56) References Cited

U.S. PATENT DOCUMENTS

| | | | |
|---|---|---|---|
| 7,420,198 B2 * | 9/2008 | Baek et al. | 257/2 |
| 7,629,198 B2 * | 12/2009 | Kumar et al. | 438/104 |
| 7,639,521 B2 * | 12/2009 | Baek et al. | 365/148 |
| 7,867,814 B2 * | 1/2011 | Nihei et al. | 438/102 |
| 7,872,900 B2 * | 1/2011 | Paz de Araujo et al. | 365/148 |
| 7,924,138 B2 * | 4/2011 | Kinoshita et al. | 338/20 |
| 7,960,775 B2 * | 6/2011 | Courtade et al. | 257/312 |
| 8,059,447 B2 * | 11/2011 | Scheuerlein et al. | 365/148 |

(Continued)

FOREIGN PATENT DOCUMENTS
WO WO2008/107941 9/2008

OTHER PUBLICATIONS

Kinoshita, K. et al., "Thermal Properties of NiOy Resistor Practically Free From the 'Forming' Process", Extended Abstracts of the 2006 International Conference on Solid State Devices and Materials, Yokohama, 2006, pp. 570-571.

(Continued)

*Primary Examiner* — Son Mai
(74) *Attorney, Agent, or Firm* — McDonnell Boehnen Hulbert & Berghoff LLP

(57) ABSTRACT

A resistive switching non-volatile memory element is disclosed comprising a resistive switching metal-oxide layer sandwiched between and in contact with a top electrode and a bottom electrode, the resistive switching metal oxide layer having a substantial isotropic non-stoichiometric metal-to-oxygen ratio. For example, the memory element may comprise a nickel oxide resistive switching layer sandwiched between and in contact with a nickel top electrode and a nickel bottom electrode whereby the ratio oxygen-to-nickel of the nickel oxide layer is between 0 and 0.85.

14 Claims, 12 Drawing Sheets

U.S. PATENT DOCUMENTS

| | | |
|---|---|---|
| 8,097,878 B2 * | 1/2012 | Kumar et al. .................... 257/43 |
| 8,134,865 B2 * | 3/2012 | Chang et al. .................. 365/163 |
| 2008/0211011 A1 | 9/2008 | Takashima et al. |
| 2008/0278990 A1 * | 11/2008 | Kumar et al. ................. 365/148 |
| 2009/0001343 A1 * | 1/2009 | Schricker et al. ................. 257/4 |
| 2009/0052226 A1 * | 2/2009 | Lee et al. ...................... 365/148 |
| 2009/0231910 A1 * | 9/2009 | Liu et al. ....................... 365/163 |
| 2009/0272959 A1 * | 11/2009 | Phatak et al. ..................... 257/2 |
| 2009/0309690 A1 | 12/2009 | Kinoshita et al. |
| 2010/0163823 A1 * | 7/2010 | Sim et al. .......................... 257/2 |
| 2010/0207094 A1 * | 8/2010 | Kanzawa et al. ................. 257/4 |
| 2010/0277967 A1 * | 11/2010 | Lee et al. ...................... 365/148 |
| 2011/0001110 A1 * | 1/2011 | Takahashi ......................... 257/2 |
| 2011/0081748 A1 * | 4/2011 | Kumar et al. ................. 438/104 |

OTHER PUBLICATIONS

Sun, Xiao et al., "Resistive Switching in $CeO_X$ Films for Nonvolatile Memory Application", IEEE Electron Device Letters, vol. 30, No. 4, Apr. 2009, pp. 334-336.

European Search Report, European Patent Application 10164268.4 dated Jul. 21, 2010.

International Technology Roadmap for Semiconductors, 2005 Edition, "Process Integration, Devices and Structures", 56 pages.

Kinoshita, K. et al., "Universal Understanding of Direct Current Transport Properties of ReRAM Based on a Parallel Resistance Model", J. Mater. Res., vol. 23, No. 3, Mar. 2008, pp. 812-818.

\* cited by examiner

METHOD FOR MANUFACTURING A RESISTIVE SWITCHING MEMORY CELL COMPRISING A NICKEL OXIDE LAYER OPERABLE AT LOW-POWER AND MEMORY CELLS OBTAINED THEREOF

CROSS-REFERENCE TO RELATED APPLICATIONS

The present application claims priority to U.S. Provisional Patent Application No. 61/183,226 filed in the US Patent and Trademark Office on Jun. 2, 2009, the entire contents of which is incorporated herein by reference.

BACKGROUND

1. Field of the Invention

The present disclosure relates to a non-volatile memory cell comprising a reversible resistance switching metal oxide layer, its resistance value being representative of the data stored in the memory cell.

2. Description of the Related Art

Today the Flash non-volatile memory (NVM) technology dominates the market of non-volatile memories. In a flash NVM memory charge is stored in a conductive or non-conductive charge storage layer incorporated in a MOSFET structure. It is expected that this type of non-volatile memory technology will face severe scaling problems beyond the 45 nm technology node due to fundamental physical limitations associated with this data storage mechanism as put forward in the International Technology Roadmap for Semiconductors (ITRS), "2005 edition, Process integration, Devices and Structures" as downscaling the memory cell dimensions inherently leads to a reduction of the amount of charge, representative for a value of the bit, that can be stored in the memory cell.

Other non-volatile memory technologies are emerging which have the potential of allowing further downscaling of the memory cell dimensions. Among the most promising technologies is the resistive switching memory technology also known as Resistive Random Access Memory (ReRAM) technology. Such a ReRAM memory cell comprises a memory element and a selection element. The resistance of the non-volatile memory element can be reversibly varied between at least two stable resistance states employing a voltage- or current-induced change of the conductivity of the resistive switching material present in the memory cell. Each resistance state corresponds to a value of the bit stored in the memory cell.

Examples of such reversible resistive switching materials are chalcogenides, carbon polymers, selected binary metal oxides such as nickel oxide, tungsten oxide, copper oxide, ternary metal oxides such as nickel cobalt oxide or even more complex metal oxides such as Cr doped $Sr(Ti)ZrO_3$ or $Pr_{0.7}Ca_{0.3}Mn_{0.3}$.

Among the binary metal oxides nickel oxide plays a dominant role, as it forms a well characterized metal oxide having a stoichiometric nickel-to-oxide ratio 1/1. Nickel is a metal that is compatible with the mainstream CMOS technology. In a NiO based ReRAM memory cell, switching between two distinct resistance states is related to the formation and disruption of conductive filaments throughout the resistive switching NiO. As the filament width is believed to be in the range of nanometers, the NiO ReRAM memory cell can be scaled below the 45 nm technology node.

The unipolar resistive-switching of a NiO based ReRAM memory cell can be described as follows: 1) the cell resistance is initially high and requires a so-called electro-forming voltage to generate conductive filaments through the NiO matrix and to switch the cell to the low-resistive state (LRS), this electro-forming voltage is typically 3V or higher; 2) the created filaments can be disrupted in a sort of fuse blow using a high current, called reset current, so that the cell returns to a high resistive state (HRS), this reset current is typically in the milli-ampere range; 3) the filaments can be restored using a set voltage lower than the electro-forming voltage. A drastic reduction of these operating parameters is mandatory to allow scaling of the NiO-based ReRAM memory cell.

Kinoshita et al. discusses in "Universal understanding of direct current transport properties of ReRAM based on a parallel resistance model," Journal of Material Research, Vol. 23, No. 3, March 2008 various models for the switching behaviour of binary metal oxides, in particular of a nickel oxide layer sandwiched between two platinum electrodes. In this paper the temperature and area dependency of the low resistance state (LRS) and the high resistance state (HRS) was studied.

A major drawback of the state-of-the-art NiO based ReRAM memory cells is that they require high electro-forming voltage and reset current.

SUMMARY

It is an object of embodiments to provide a ReRAM memory cell and a method for manufacturing such cell.

The above objective is accomplished by a device and a method according to the disclosed embodiments.

It is an advantage of a metal oxide based ReRAM memory element according to the embodiments that it is scalable.

It is an advantage of a metal oxide based ReRAM memory element according to the embodiments that it can operate at a low set and reset power.

It is an advantage that the reset current $I_{reset}$ of unipolar resistive-switching non-volatile memory elements according to the embodiments, for resetting the memory element to a high resistive state, can be less than 100 uA, for example less than 50 uA. The resistivity of this high resistive state increases with temperature.

It is an advantage that the set voltage $V_{set}$ of unipolar resistive-switching non-volatile memory elements according to the embodiments can be less than 1V.

It is an advantage of a metal oxide based ReRAM memory element according to the embodiments that it has a low forming step voltage $V_{forming}$, e.g. below 3 Volts.

It is an advantage of a metal oxide based ReRAM memory element and a method for operating such memory element according to the embodiments that it provides a reproducible filament formation and erasure.

It is an advantage of a metal oxide based ReRAM memory element according to the embodiments that it has better retention properties than prior art devices.

In a first aspect a unipolar resistive-switching non-volatile memory element is disclosed, comprising a metal-oxide layer sandwiched between and in contact with a top electrode and a bottom electrode, the resistivity of the metal-oxide layer being switchable between a low resistive state (LRS) and a high resistive state (HRS). The resistive switching metal oxide layer has a substantial isotropic substoichiometric oxygen-to-metal ratio selected to have a forming voltage $V_{forming}$, for bringing the memory element into an initial low resistive state, of 1V or less. It has been found experimentally, for example, that the change from a ratio O/Ni=1 to O/Ni=0.75 allows for the reduction of $V_{forming}$ from a few volts down to 0.9-1V.

In a memory element according to the embodiments, the reset current $I_{reset}$, required for setting the memory element to a high resistive state, may be less than 100 uA, for example less than 50 uA. This may be obtained due to the substoichiometric oxygen-to-metal ratio of the metal-oxide layer, coupled to a specific microstructure obtained for a particular oxidation duration.

The resistivity of the low resistance state LRS may be selected by selecting the compliance current $I_{comp}$ imposed on the measurement equipment, and applied when bringing the memory element into the low resistance state LRS. As different compliant currents lead to different low resistance states, multilevel programming may be obtained. The compliance current $I_{comp}$ of the voltage set switching may be selected so as to obtain a semiconducting low resistive state. This semiconducting low resistive state may be obtained by forming semiconducting filaments in the resistive switching metal oxide layer.

The metal oxide layer of a memory element according to the embodiments may be a binary metal oxide layer such as for example a nickel oxide layer. The oxygen-to-nickel ratio of the nickel oxide layer may be between 0 and 0.85.

If nickel oxide is used as metal oxide layer, then the bottom electrode can comprise nickel. A bottom electrode can then, for example, comprise a nickel containing layer contacting the nickel oxide layer, and a titanium containing layer contacting the nickel containing layer. A particular bottom electrode can be structured as follows: a nickel layer contacting the nickel oxide layer, a titanium nitride layer contacting the nickel layer, and a titanium layer contacting titanium nitride layer.

If nickel oxide is used as metal oxide layer, then the top electrode can comprise or consist of nickel.

A selection element can be in electrical contact with one of the electrodes of the memory element thereby forming a selectable memory cell. Such a selection element can be a MOSFET, and one of the source/drain junctions of the MOSFET is electrically connected to one of the electrodes.

In a second aspect, methods for forming the resistive switching non-volatile memory elements of the first aspect are disclosed, the methods comprising obtaining a substrate, forming a bottom electrode on the substrate, forming a resistive switching metal oxide layer on the bottom electrode, the metal oxide layer having a substantial isotropic non-stoichiometric metal-to-oxygen ratio, and forming a top electrode on the metal oxide layer.

The metal oxide layer of this memory element may be a binary metal oxide layer such as a nickel oxide layer. The oxygen-to-nickel ratio of the nickel oxide layer may be between 0 and 0.85.

If nickel oxide is used as metal oxide layer, then the bottom electrode can comprise nickel. A bottom electrode can then contain a nickel containing layer contacting the nickel oxide layer, and a titanium containing layer contacting the nickel containing layer. A particular bottom electrode can be structured as follows: a nickel layer contacting the nickel oxide layer, a titanium nitride layer contacting the nickel layer, and a titanium layer contacting titanium nitride layer.

If nickel oxide is used as metal oxide layer, than the top electrode can comprise or consist of nickel.

In a third aspect, a method for multi-level programming of the unipolar resistive-switching non-volatile memory elements according to the first aspect is disclosed, whereby the memory element comprises a metal-oxide layer sandwiched between and in contact with a top electrode and a bottom electrode, the resistivity of the metal-oxide layer being switchable between a low resistive state (LRS) and a high resistive state (HRS), whereby the resistive switching metal oxide layer has a substantial isotropic substoichiometric oxygen-to-metal ratio selected to have a forming voltage $V_{forming}$, for bringing the memory element into an initial low resistive state, of 1V or less. The programming method comprises selecting a value for the low resistance state LRS, and selecting a value of the set power, for being applied during the set voltage switching, in view of the selected low resistance state, and switching the memory element into a low resistance state LRS by applying the selected set voltage $V_{set}$. The value for the set power can be selected by selecting a value of the compliance current $I_{COMP}$, applied during the set voltage switching. In particular embodiments, the selected set voltage is 1V or less, and the selected compliance current is in the range of 0.1 uA to 1 mA depending on the desired low resistance state. The low resistance state is of a semiconducting behaviour obtained by forming semiconducting filaments in the resistive switching metal oxide layer.

For purposes of summarizing the disclosed embodiments and the advantages achieved over the prior art, certain objects and advantages have been described herein above. Of course, it is to be understood that not necessarily all such objects or advantages may be achieved in accordance with any particular embodiment. Thus, for example, those skilled in the art will recognize that the disclosed embodiments may be carried out in a manner that achieves or optimizes one advantage or group of advantages as taught herein without necessarily achieving other objects or advantages as may be taught or suggested herein.

DETAILED DESCRIPTION

Figure 1:
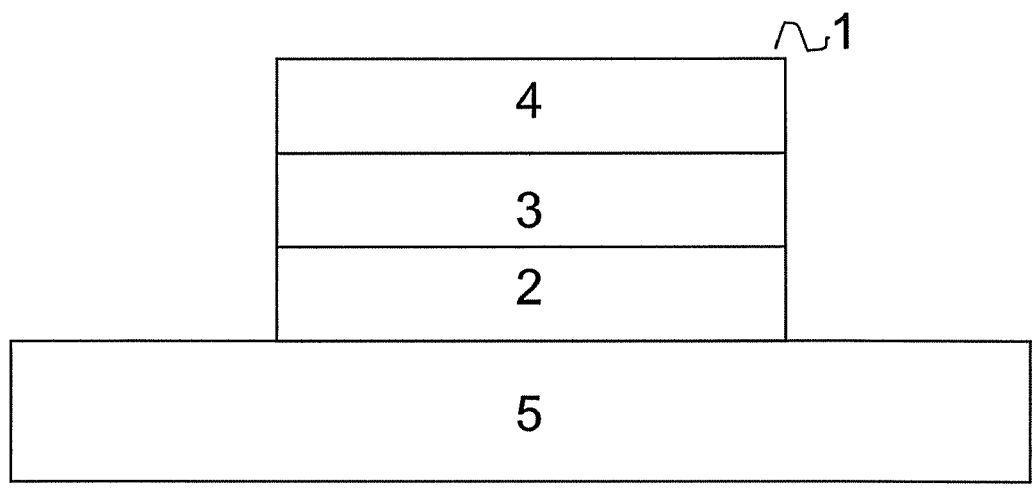
FIG. 1 shows a schematic cross-sectional view of a substoichiometric nickel oxide memory element according to a first aspect.

The present systems and methods will be described with respect to particular embodiments and with reference to certain drawings but the invention, as set forth in the claims, is not limited to those embodiments. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Moreover, the terms over, under, underneath and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various features. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as encompassing one or more separate embodiments of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures, and techniques have not been shown in detail in order not to obscure an understanding of this description.

In a first aspect a resistive switching nonvolatile memory element 1 is disclosed comprising a metal oxide layer 3 sandwiched between and in contact with a bottom electrode 2 and a top electrode 4. The bottom electrode 2 is formed on a substrate 5. The resistive switching metal oxide layer ($M_xO_y$) has a substantial isotropic non-stoichiometric oxygen-to-metal y/x ratio, in particular the effective oxygen-to-metal ratio $(y/x)_{eff}$ is smaller than the stoichiometric oxygen-to-metal ratio $(y/x)_{sto}$: $(y/x)_{eff} < (y/x)_{sto}$ or $[(y/x)_{eff}/(y/x)_{sto}] < 1$. In particular embodiments, $[(y/x)_{eff}/(y/x)_{sto}]$ is less than 0.85. FIG. 1 shows a schematic cross-section of such memory element 1.

In order to form a particular metal oxide $M_xO_y$, metal and oxygen atoms must be provided in a well-defined oxygen-to-metal ratio y/x. This ratio is known as stoichiometric when the metal and oxygen atoms involved are provided in the exact proportions required to form the selected metal oxide. This stoichiometric ratio corresponds to the proportion of the elements required to form the unit molecule of a compound in a given crystalline state. In case of nickel oxide when in the cubic face centered state, this stoichiometric ratio $(y/x)_{sto} = 1$ for NiO: for every nickel atom Ni one oxygen atom O (or ½ $O_2$) is to be provided. If, however, one of the substances, either metal or oxygen is provided in an amount different from, i.e. greater than or smaller than, the amount required to form the desired metal oxide, the resulting metal oxide is said to be non-stoichiometric. If in case of nickel oxide, nickel is provided in a proportion more than required to have a 1-to-1 ratio in the resulting nickel oxide, the nickel oxide is said to be non-stoichiometric, in this particular example one calls the $Ni_xO_y$ with $(y/x)_{eff} < 1$ a metal-rich metal oxide as nickel is in excess of the stoichiometric ratio. Alternatively one can call this metal oxide, when oxygen is in a proportion less than required by stoichiometry, an oxygen-deficient metal oxide. Although nickel oxide is used for the purpose of teaching, the metal oxide layer 3 can be formed by providing other metal oxides such as for example, but not limited thereto, TiOx, HfOx, ZrOx, CuOx, WOx, in a non-stoichiometric ratio in order to obtain a resistive switching nonvolatile memory element showing the unipolar low power switching characteristics.

Although the composition of the metal oxide $M_xO_y$ in resistive switching devices according to the embodiments is non-stoichiometric, in particular oxygen-deficient, this composition may be substantially uniform over the volume of the metal oxide layer formed. In particular embodiments, there is essentially no gradient or variation in the non-stoichiometric oxide-to-metal ratio $(y/x)_{eff}$ over the formed metal oxide layer in either direction. The non-stoichiometric oxide-to-metal ratio $(y/x)_{eff}$ may be substantially isotropic over the wafer and over the metal oxide layer thickness. In particular embodiments, this ratio $(y/x)_{eff}$ may vary less than 10%, for example less than 5%, over the wafer and over the layer thickness.

In particular embodiments, this metal oxide layer may be a layer of a binary metal oxide, such as for example, but not limited thereto, nickel oxide. If the metal oxide layer is a nickel oxide $Ni_xO_y$ layer the non-stoichiometric oxygen-to-nickel ratio $(y/x)_{eff}$ may be between 0 and 0.85: $0 < (y/x)_{eff} \leq 0.85$. In particular embodiments, the non-stoichiometric oxygen-to-nickel ratio $(y/x)_{eff}$ may be between 0.6 and 0.85: $0.6 < (y/x)_{eff} \leq 0.85$. The non-stoichiometric oxygen-to-nickel ratio $(y/x)_{eff}$ can be between 0.6 and 0.75: $0.6 \leq (y/x)_{eff} \leq 0.75$.

The bottom electrode 2 of the memory element illustrated by FIG. 1 is formed of one or more conductive materials. In particular embodiments, for example if the metal oxide layer 3 is a nickel oxide layer, the bottom electrode 2 can comprise nickel. In particular embodiments, the bottom electrode 2 may comprise a layer of nickel or a nickel containing layer 6 in contact with the metal oxide layer 3. The bottom electrode 2 can further comprise a second conductive layer, such as e.g. a titanium nitride containing 7 layer, contacting the nickel containing layer 6. The bottom electrode 3 can further comprise a third conductive layer, e.g. a titanium containing layer 8, contacting the second conductive layer, in the example given the titanium nitride containing layer 7.

The top electrode 4 of the memory element illustrated in FIG. 1 is formed of one or more conductive materials such as, for example, TiN or Ni. The top electrode 4 can comprise or consist of a TiN layer 10. The TiN may contact the metal oxide, e.g. nickel oxide, resistive switching layer 3. In alternative embodiments, the top electrode 4 can comprise or consist of nickel. In particular embodiments, the top electrode 4 comprises a layer of nickel 9 in contact with the metal oxide layer 3. The top electrode 4 can comprise a nickel layer 9 in contact with the metal oxide layer 3, and a TiN layer 10 on top thereof.

Figure 2:
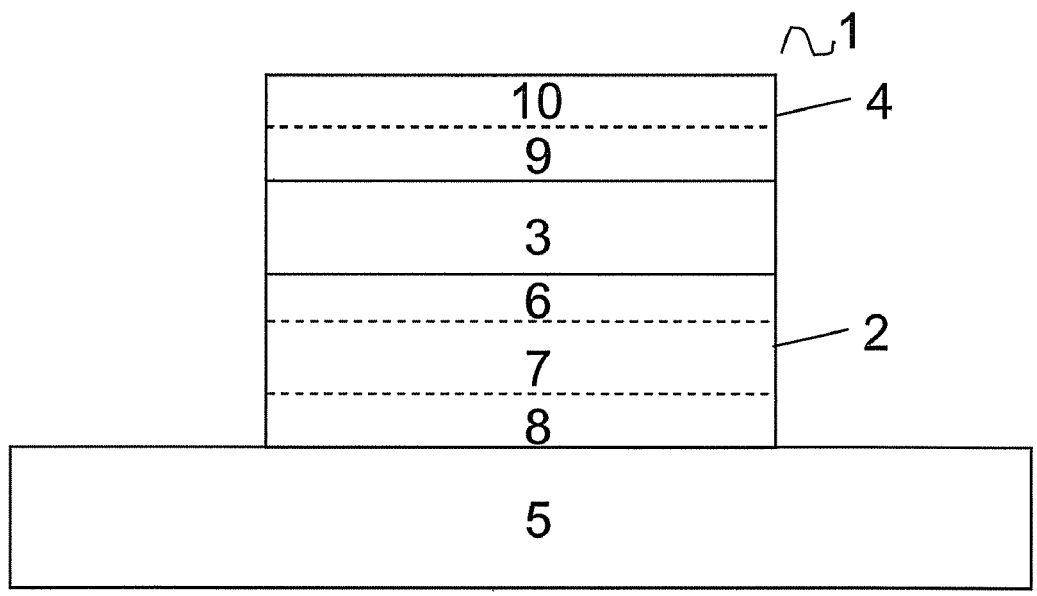
FIG. 2 shows a schematic cross-sectional view of a substoichiometric nickel oxide memory element according to a particular embodiment of the first aspect.

A particular embodiment is illustrated in FIG. 2 showing a resistive switching nonvolatile memory element comprising a nickel oxide $Ni_xO_y$ layer 3 sandwiched between and in contact with a bottom electrode 2 and a top electrode 4. The bottom electrode 2 is formed on a substrate 5. The resistive switching nickel oxide layer has a substantial isotropic non-stoichiometric oxygen-to-nickel ratio $(y/x)_{eff}$ with $0 < (y/x)_{eff} \leq 0.85$. The bottom electrode 2 is a stack of a layer of nickel 6 in contact with the nickel oxide layer 3, a titanium nitride containing layer 7 contacting the nickel containing layer 6 and a titanium containing layer 8 contacting the titanium nitride containing layer 7. The top electrode 4 is a stack of a layer of nickel 9 in contact with the nickel oxide layer 3 and a TiN layer 10 in contact with the nickel layer 9.

A nonvolatile resistive switching memory element according to the embodiments can be set and erased using low-current levels, e.g. less than 100 uA, for example less than 50 uA, and low-voltage levels, e.g. less than 1.5V, for example less than 1V. This low operation power is allowed by the substoichiometric nature of the $M_xO_y$ layer, e.g. the $Ni_xO_y$ layer, consisting of a reasonably high density of oxygen-vacancy defects. Indeed, a low electrical power allows the formation of a conductive filament presumably consisting of a chain of oxygen vacancies from bottom to top electrode. Such a low-power filament formation also avoids extended damage generation, and thus a low power is also effective to reset (or disrupt) this latter formed filament.

Also, a memory cell is disclosed comprising a memory element according to any of the foregoing embodiments, and a selection element in electrical contact with one of the electrodes. This selection element can be a MOSFET, one of the source/drain junctions of the MOSFET being electrically connected to one of the electrodes. During operation of the memory cell electrical access to the memory element 1 is provided via the top electrode 2 and/or bottom electrode 3 of the memory element 1 when selected by means of the corresponding selection element.

In a second aspect methods for manufacturing a memory element according to any of the embodiments of the previous aspects are disclosed.

Figure 3:
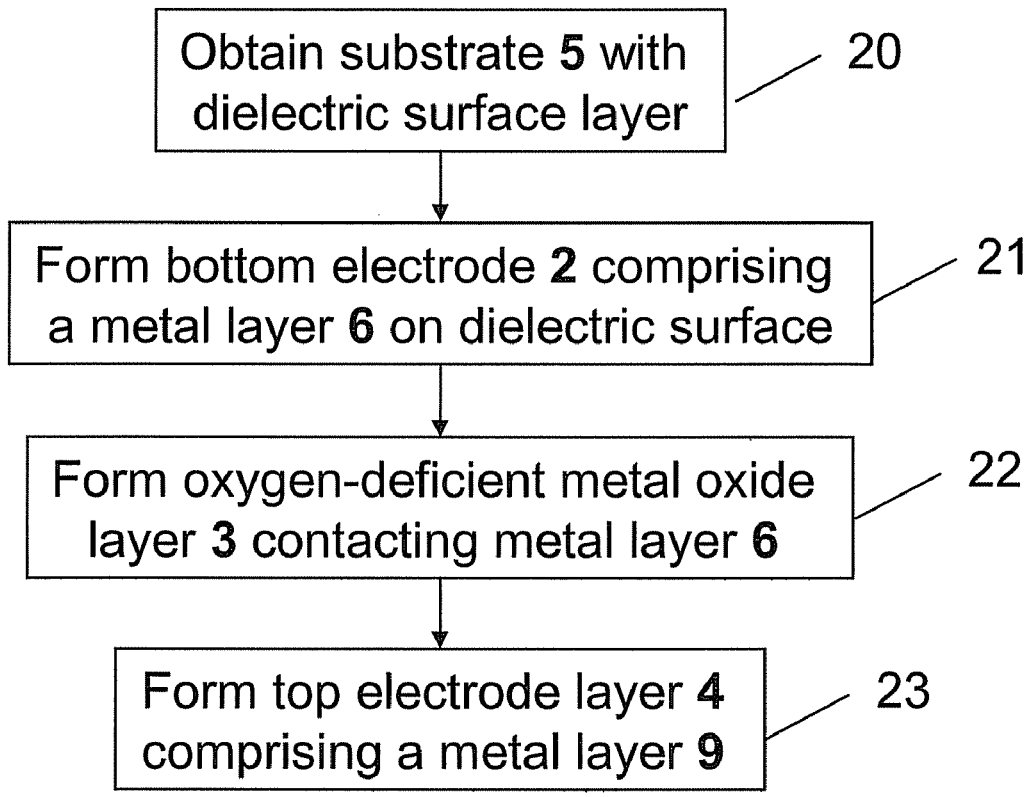
FIG. 3 shows a flow chart listing process steps according to a second aspect for manufacturing a substoichiometric nickel oxide memory element according to the first aspect.

The metal oxide, e.g. NiO, memory element 1 is formed by first obtaining a substrate 5 having a dielectric surface layer (step 20 of the flowchart illustrated in FIG. 3). This dielectric surface layer can, for example, be a silicon oxide layer formed on a silicon substrate. Then a bottom electrode 2 comprising a metal layer e.g. a nickel layer 11, is formed on this dielectric surface layer of the substrate 5 (step 21 of FIG. 3). The metal layer such as, for example, nickel layer 11, may be formed in any suitable way, for example, by Physical Vapour Deposition (PVD) by DC sputtering at room temperature. Optionally an annealing step in a non-oxidizing ambient can be performed prior to the step of oxidizing the metal layer such as nickel layer 11, to control the crystal structure of the metal layer e.g. metal layer such as nickel layer 11, and the underlying bottom electrode 2. This metal layer, e.g. nickel layer 11, can have an as-deposited thickness in the range of 20 to 100 nm. A metal oxide $M_xO_y$, e.g. nickel oxide $Ni_xO_y$, resistive switching layer 3 with a substantial isotropic non-stoichiometric oxygen-to-metal ratio $y/x$, the effective oxygen-to-metal ratio $(y/x)_{eff}$ being smaller than the stoichiometric oxygen-to-metal ratio $(y/x)_{sto}$, is formed in contact with this conductive layer, e.g. nickel layer 11 (step 22 of FIG. 3). In particular embodiments, this metal oxide layer 3 may be formed by thermal oxidation of exposed regions of the bottom electrode 2 whereby the conductive layer, e.g. nickel layer 11, may be only partially oxidized such that a conductive, e.g. nickel layer 6, remains underneath and in contact with the metal oxide layer, e.g. nickel oxide layer 3. The thickness of the metal oxide layer, e.g. nickel oxide layer 3, can be in the range of 15 nm to 150 nm depending on the thickness of the initial conductive layer, e.g. nickel layer 11, and on the thermal budget of the oxidation process. The oxygen ambient for oxidizing the conductive layer, e.g. metal layer such as nickel layer 11, may be at about 100% $O_2$. At a predetermined oxidation temperature, the oxidation time can last for a predetermined time selected in view of the thickness of the as-deposited metal layer. As an example only, at about 500° C., the oxidation time for Ni can range from 1 to 10 min, whereby the actual oxidation time may be chosen in view of the thickness of the as-deposited metal layer, e.g. nickel layer 11. For a nickel layer 11 of about 100 nm, the oxidation time and temperature may be about 500° C. for a time in the range 1 to 3 minutes. For a nickel layer 11 of about 20 nm, the oxidation time and temperature may be about 400° C. for a time in the range 3 to 10 minutes. In this thermal budget range a substantial similar effective substoichiometric ratio was obtained. By means of transmission electron microscopy and electron energy loss spectroscopy (TEM/EELS) investigation, it was shown that no significant composition variation in the thus formed nickel oxide layer 3 occurred in this time range of 1 to 10 minutes oxidation time, as the Ni oxide remained oxygen deficient. On the other hand, in this range of 1 to 10 minutes oxidation time the thickness of the nickel oxide layer 3 formed increased by less than 10 nm as measured from SEM imaging; however a strong increase of the NiO peaks intensity on blanket layers was evidenced by X-ray diffraction. Then a top electrode 4 is formed contacting the metal oxide layer, e.g. nickel oxide layer 3 (step 23 of flowchart 3). The top electrode 4 may be a metal layer, for example a nickel layer 9 deposited on the metal oxide, e.g. nickel oxide layer 3. Optionally a further conductive layer, such as a TiN layer 10, can be formed contacting the metal layer, e.g. nickel layer 9.

Figure 4:
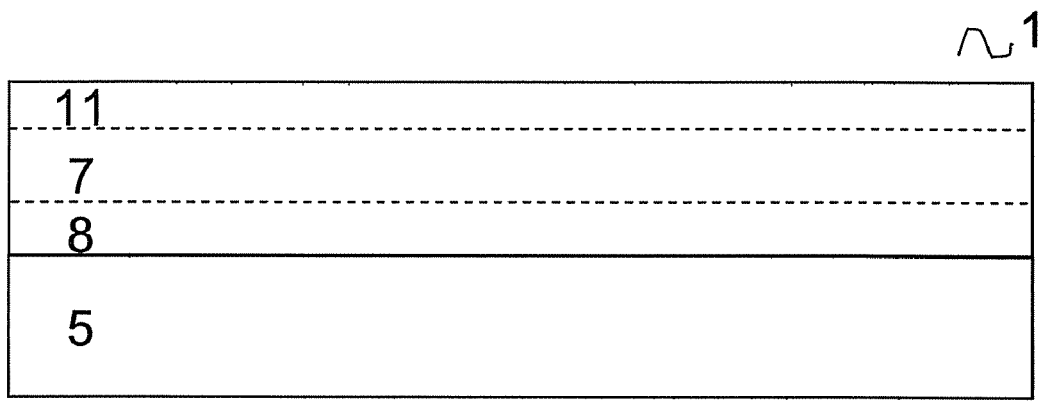
FIG. 4 to FIG. 8 illustrate by schematic cross-sectional views process steps of a process flow according to a second aspect for manufacturing a substoichiometric nickel oxide memory element according to the first aspect.
Figure 5:
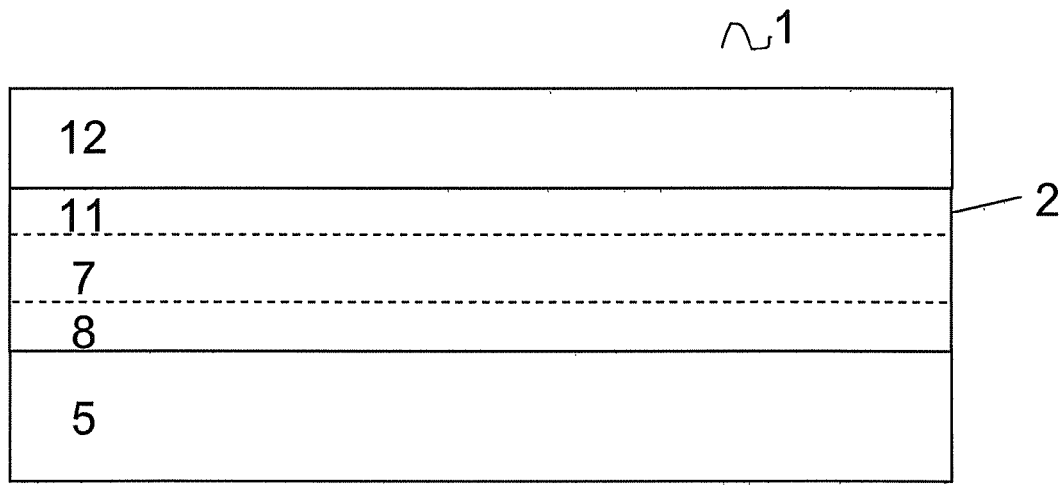
Figure 6:
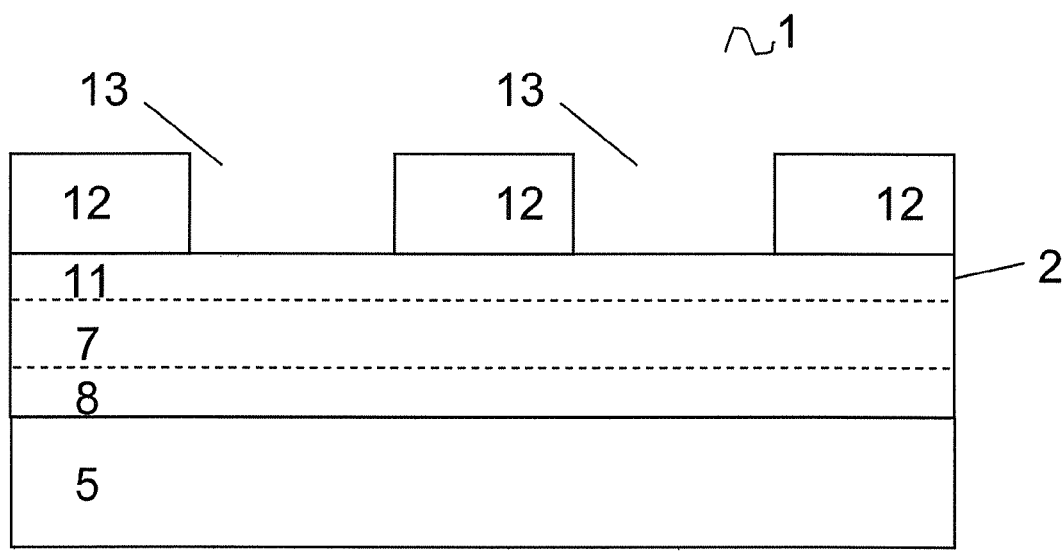
Figure 7:
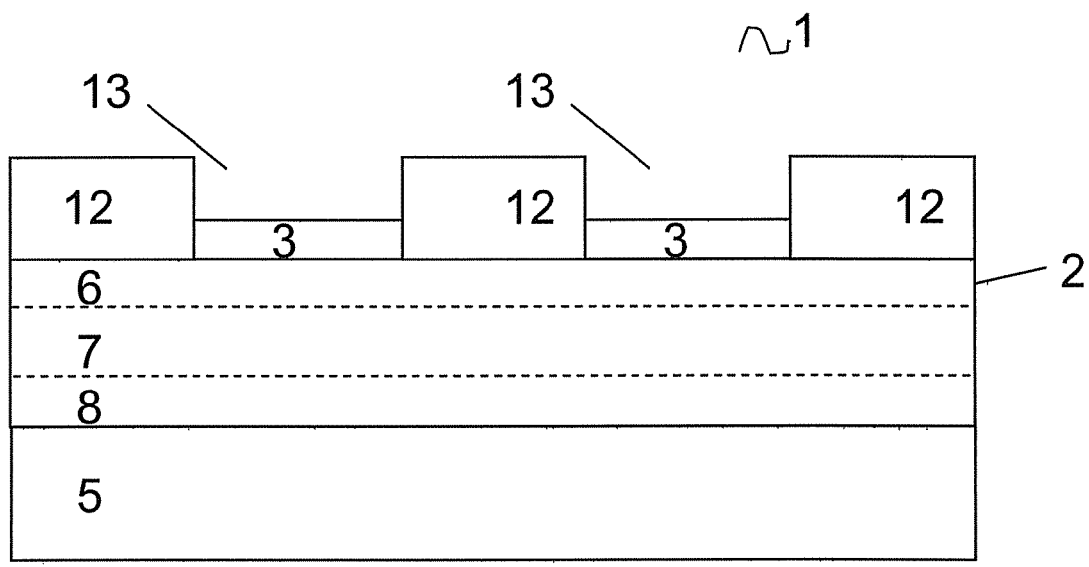
Figure 8:
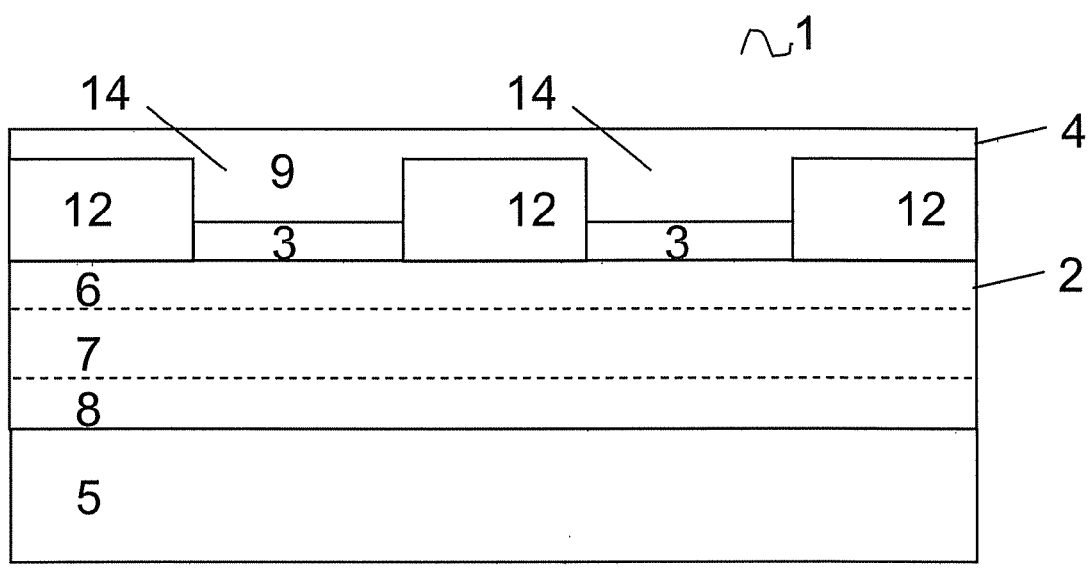

In a particular embodiment the metal oxide memory element 1 is a NiO memory element which was manufactured as follows, illustrated by FIGS. 4 to 8. First, a Ni layer 11 is deposited on a TiN 7/Ti 8 stack formed on a $SiO_2$ insulating layer of a substrate 5 (FIG. 4). The thickness of this Ni layer 11 can be in the range from 20 nm to 100 nm. Then, a $SiO_2/Si_3N_4$ dielectric stack 12, for example with a thickness of about 200 nm, is deposited over the Ni layer 11 (FIG. 5). Contact holes 13, having a diameter of about 80 nm, to the underlying Ni layer 11 are opened in this dielectric stack 12, for example using 193 nm photolithography patterning and dry etching of the exposed dielectric regions (FIG. 6). These contact holes 13 expose the underlying Ni layer 11. Subsequently, thermal oxidation of the exposed regions of the underlying Ni layer 11 is performed at 500° C., during 1 min, under pure oxygen (100%) ambient, leading to the growth of an about 40 nm thick substoichiometric NiO 3 layer within the contact holes 13 (FIG. 7). The NiO 3 layer will at least partially fill the contact hole 13. A part of the underlying Ni layer 6 remains unoxidized and will become part of the bottom electrode 2. Finally, a 100 nm thick large Ni top electrode 9 is deposited overlying the at least partially filled contact holes 13, resulting in a multiple-contact Ni 9/NiO 3/Ni 6 memory cell having a total contact area of about 10 µm² (FIG. 8).

In FIGS. 4 to 8, the manufacturing of multiple contact memory cells was illustrated whereby each memory cell has multiple contacts 14 from the top electrode 9 to the resistive switching layer 3. One can also manufacture a single contact memory cell (not illustrated in the drawings) whereby only a single contact is provided to the resistive switching layer 3 by confining the switching element $M_xO_y$, e.g. $Ni_xO_y$, within a contact hole. A conductive layer, e.g. a TiN layer 10, may be provided overlying the resistive switching layer 3.

The NiO memory element fabricated in accordance with the particular embodiment of the second aspect is used to determine the resistive switching properties of a substoichiometric $Ni_xO_y$ layer. As explained earlier, the unipolar resistive-switching of nickel oxide layer can be described as follows: 1) the cell resistance of the pristine $Ni_xO_y$ layer is initially high and requires a so-called electro-forming voltage $V_{FORMING}$ to generate conductive filaments through the nickel oxide matrix and to switch the cell to the low-resistive state (LRS); 2) the created filaments can be disrupted in a sort of fuse blow using a high current, called reset current $I_{RESET}$, so that the cell returns to a high resistive state (HRS); 3) the filaments can be restored using a set voltage $V_{SET}$ lower than the electro-forming voltage $V_{FORMING}$: $V_{SET} < V_{FORMING}$.

The thermal mechanisms involved with the set switching may generate different filament configurations, e.g. the number, distribution, and/or size of the filaments formed in the substoichiometric nickel oxide resistive switching layer may change depending, inter alia, on the actual thermal energy provided. As the reset switching can be regarded as a thermal-driven oxidation of the formed filaments, the required reset power may fluctuate depending on the quality and quantity of these filaments. As this filament oxidation may vary for a given reset power and a given filament configuration, the set voltage required to restore the filaments may also fluctuate.

Current-voltage (I-V) characteristics were investigated using a standard semiconductor parameter analyzer (SPA), which gives useful information into basic cell properties; however, the measurements should be carried out carefully. Indeed, the SPA tool is not able to limit on the nanosecond scale the discharge of parasitic capacitances between the cell and the system during the switching to the low resistive state, the latter being regarded as a soft-breakdown. Such current discharge at a high voltage is likely to extend the creation of filaments in the $Ni_xO_y$ layer in an uncontrolled manner, and thus increases the breakdown-related damage. This in turn results in a higher subsequent reset power $P_{RESET} = I_{RESET} \times V_{RESET}$ with $I_{RESET}$ being for filament erasure and repair of the breakdown-related damage, as the reset switching is a thermal mechanism.

Extended filament creation is limited for conductive material/substoichiometric $M_xO_y$/conductive material cells, e.g. Ni/substoichiometric $Ni_xO_y$/Ni cells, according to the embodiments, whereby a substoichiometric $M_xO_y$, e.g. $Ni_xO_y$, layer 3, is sandwiched between a conductive layer, e.g. a Ni layer in the top electrode 4 and bottom electrode 2. The memory element according the above embodiments, when implemented as a Ni/$Ni_xO_y$/Ni cell, showed an exceptionally low $V_{FORMING}$ of about 1V or less. For this low forming voltage the discharge power of the SPA tool and the associated heat generation are limited. This exceptional low value of the electroforming voltage $V_{FORMING}$ of oxygen-deficient Ni/NiO/Ni cells is associated with low soft-breakdown/set field of the optimized oxygen-deficient $Ni_xO_y$ layer. By means of transmission electron microscopy and electron energy loss spectroscopy (TEM/EELS) investigation, the substoichiometric composition $NiO_{0.75}$ was evidenced as the oxygen-to-nickel ratio $(y/x)_{eff}$ was about 0.75 which is less than the stoichiometric ratio $(y/x)_{sto} = 1$ of NiO. This strong oxygen deficiency is believed to assist in both a rather low initial cell resistance and for a low electro-forming field.

The initial resistance of the substoichiometric $Ni_xO_y$ layer 3 $R_{init}$ and the forming voltage $V_{FORMING}$ increased significantly with oxidation time in the range from 1 to 10 minutes. By means of transmission electron microscopy and electron energy loss spectroscopy (TEM/EELS) investigation, it was shown that no significant composition variation in the thus formed nickel oxide layer 3 occurred in the time range of 1 to 10 minutes oxidation time, as the Ni oxide remained oxygen deficient with the substoichiometric composition $NiO_{0.75}$. On the other hand, in this range of 1 to 10 minutes oxidation time the thickness of the nickel oxide layer 3 increased by less than 10 nm as measured from SEM imaging; however a strong increase of the NiO peaks intensity on blanket layers was evidenced by X-ray diffraction. Hence, the increase of $R_{init}$ and $V_{FORMING}$ with oxidation time is assumed to be mainly due to a microstructure change, probably going along with film densification and improved crystalline order. When the oxidation duration was further reduced below 1 minute, the cells were often leaky and did not show resistive switching. It is assumed that the strong oxygen deficiency obtained for the Ni oxide film 3 together with the specific microstructure obtained for 1 minute long (or longer) oxidation accounted both for the low cell resistance and for the low electro-forming voltage.

On the other hand, it is also observed that the SPA compliance current $I_{COMP}$ setting, i.e. the current limit implied on the SPA tool, during the electro-forming stage has a critical influence on the subsequent switching properties of the cell. In particular, large $I_{COMP}$ (>1 mA) setting will result in filament configurations, e.g. a nickel oxide layer 3 having more filaments, wider filaments and/or a denser filament network, requiring large reset power $P_{RESET}$ for erasure (resetting). Such filament configurations require thus a higher reset current $I_{RESET}$, which may be obtained at higher voltages, such that the reset voltage $V_{RESET}$ may come close to $V_{SET}$.

Figure 9:
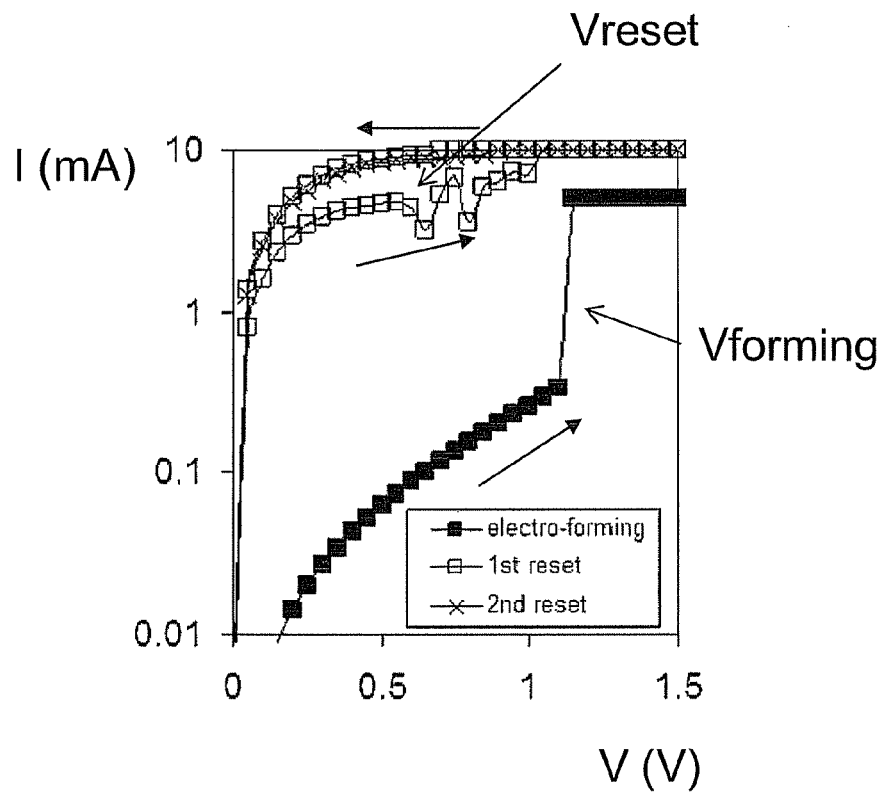
FIG. 9 and FIG. 10 show current I (A)-voltage V (V) set/reset switching curves of a memory cell according to the first aspect, respectively when the reset voltage $V_{RESET}$ is too close to the set voltage $V_{SET}$, and when current is forced and voltage compliance is used.
Figure 10:
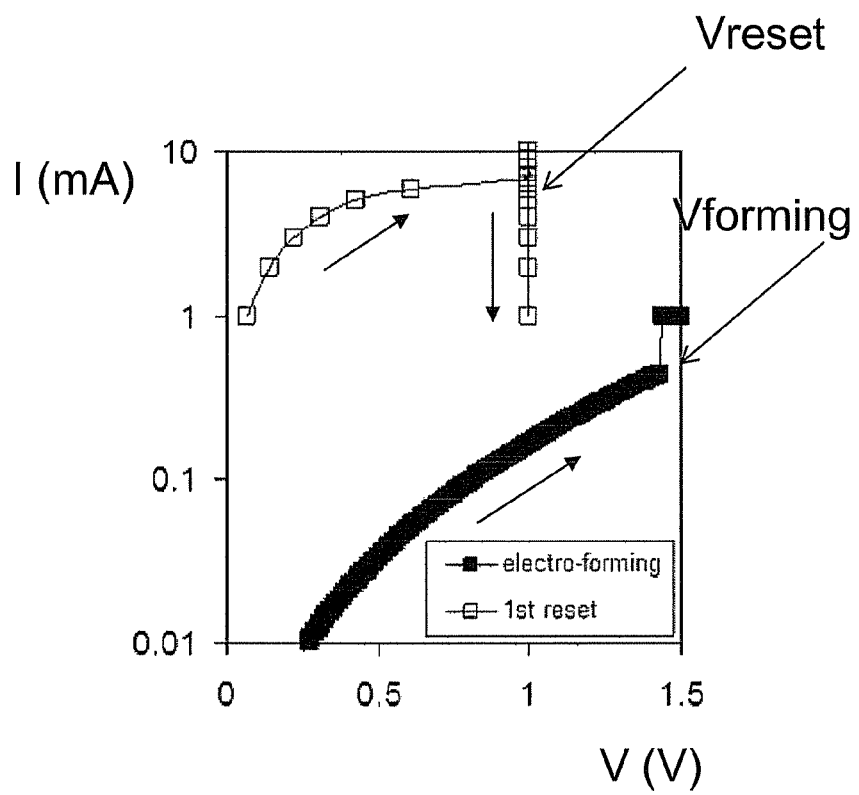

Due to the unipolar switching characteristic of the substoichiometric $M_xO_y$ layer according to the embodiments, or NiO layer in accordance with the embodiments, having a reset voltage $V_{RESET}$ approximating the set voltage $V_{SET}$ will increase the risk of parasitic set switching during the I-V reset sweep and the permanent degradation of the cell due to excessive filament formation. As shown in FIG. 9, first an electroforming step is performed resulting in a low resistive state of the NiO layer 3. When resetting this low resistive state at a reset voltage close to the set voltage, instead of resetting the NiO layer 3 to a high resistance state the NiO layer 3 remains in a low resistive state. Subsequent reset cycles fail to reset the NiO layer 3 from a low resistive state to a high resistive state. As shown in FIG. 10, this parasitic set switching is efficiently avoided using a current-controlled reset sweep with compliance voltage slightly lower than $V_{SET}$. The use of a compliance voltage lower than $V_{SET}$ makes sure that the voltage change after reset switching will not overcome $V_{SET}$ and generate parasitic set switching. After the electro-forming step, the NiO layer 3 can be reset from the low resistive state to a high resistive state by applying a reset cycle with limited voltage. In this latter case the switching control and cyclability of the cell is significantly improved.

Figure 11:
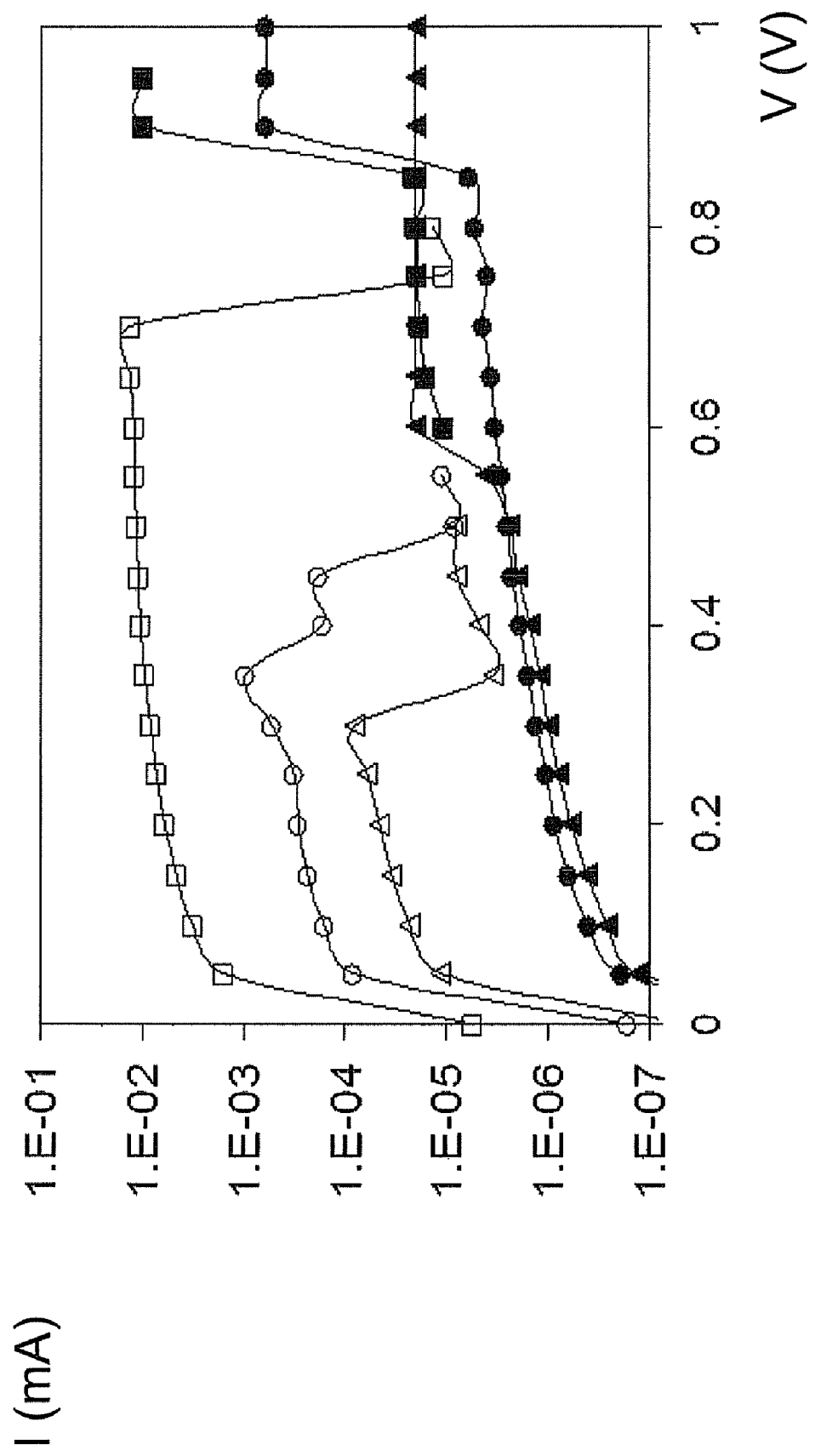
FIG. 11 and FIG. 12 show current I (A)-voltage V (V) set/reset switching curves, respectively illustrating multilevel programming on a memory cell according to the first aspect, and set-reset cycle using low-power switching, $I_{RESET}$ ~80 uA, $V_{SET}$ ~ 0.6V. The traces with black symbols show the set sweeps preceding the reset sweeps represented by corresponding empty symbols.

On the other hand, it has been observed that the voltage-controlled I-V mode gives good switching control when low $I_{COMP}$ (<1 mA) setting of the SPA is used. Moreover, as discussed earlier a lower $I_{COMP}$ allowed the formation of filament configurations requiring lower $P_{RESET}$. FIG. 11 shows set sweeps using different $I_{COMP}$ settings together with their subsequent reset sweep: open triangles $I_{COMP}$=20 uA, open circles $I_{COMP}$=600 uA, open squares $I_{COMP}$=10 mA. The traces with solid symbols represent the set sweeps preceding the corresponding reset sweeps represented by open variant of the symbol. The traces $I_{RESET}$ clearly decrease if $I_{COMP}$ is decreased. Indeed a low $I_{COMP}$ setting limits the amount of created filaments, so that the required reset power will be decreased.

Figure 12:
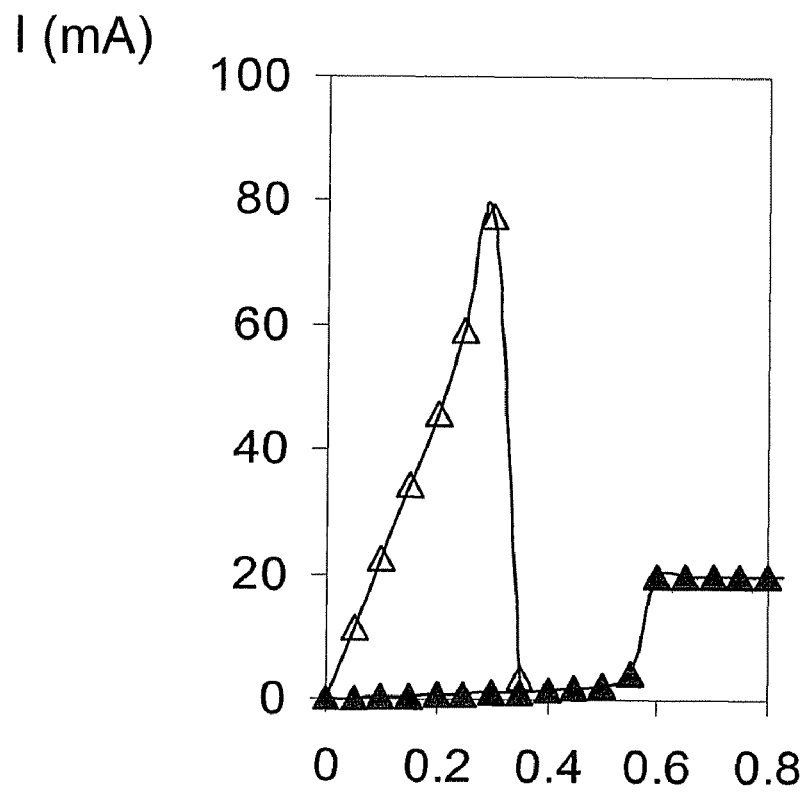

FIG. 12 shows a set/reset I-V cycle obtained using a reset current $I_{RESET}$ as low as 40 uA. During the set switching (solid triangles) the compliant current was set at 20 uA at 0.6V. This 40 uA reset current is one of the lowest reported reset currents for an undoped NiO resistive memory element probed without a MOS selecting element. As said earlier, the low resistance state obtained using low set power is specific to the Oxygen-deficient NiO resistive switching layer here disclosed.

Figures 13, 14:
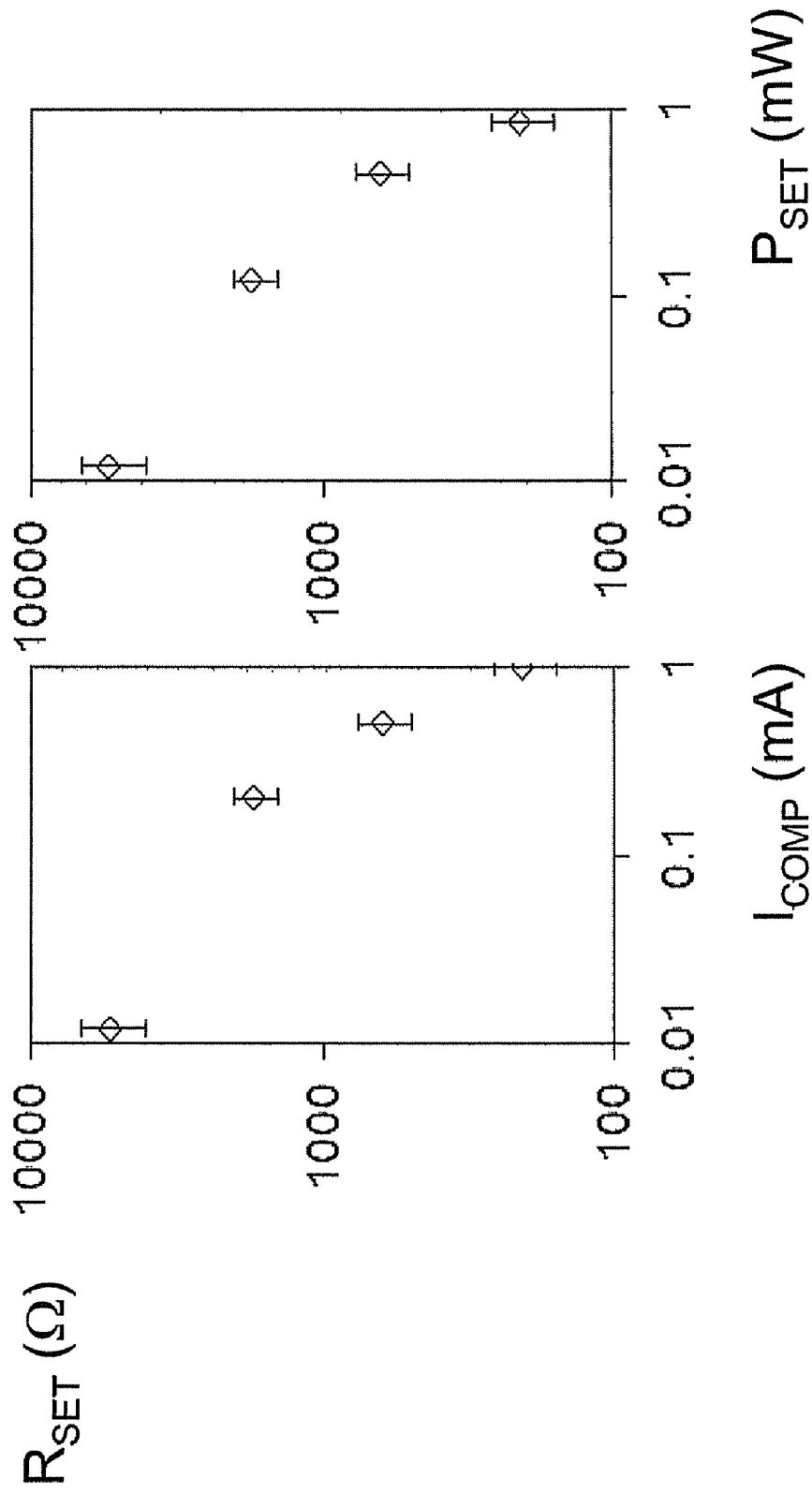
FIG. 13 and FIG. 14 show LRS resistance $R_{SET}$ of a memory cell according to the first aspect as a function of compliance current $I_{COMP}$ during set cycle and as a function of power $P_{SET}$ during set cycle, respectively.
Figures 15, 16:
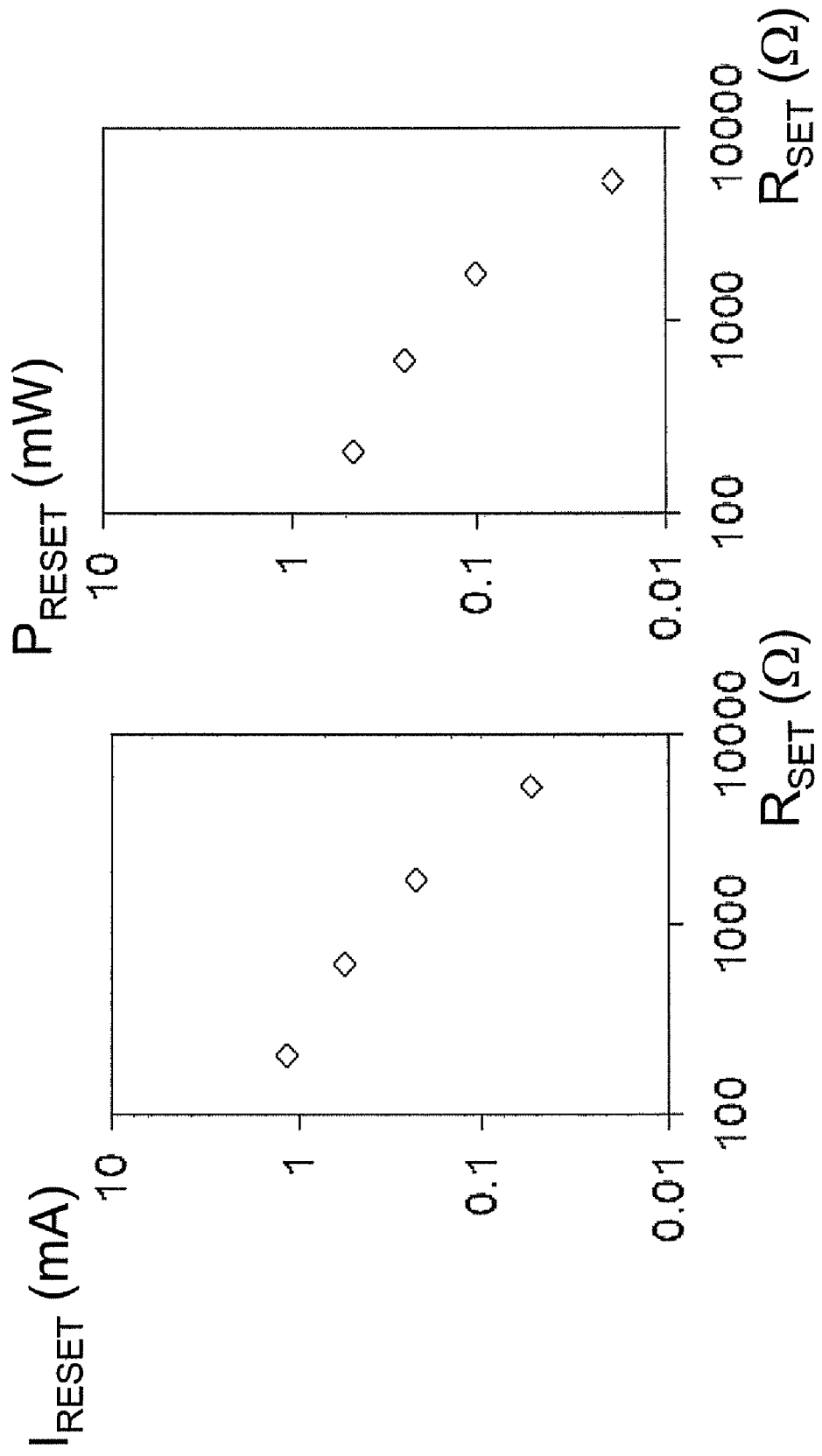
FIG. 15 and FIG. 16 show, for a memory cell according to the first aspect, the dependency on the LRS resistance $R_{SET}$ of reset current $I_{RESET}$ and reset power $P_{RESET}$, respectively.

FIG. 13 shows that the low resistance (LRS) $R_{SET}$ gradually increases with decreasing $I_{COMP}$, and FIG. 14 shows that it gradually increases with decreasing set power $P_{SET}=I_{COMP} \times V_{SET}$, suggesting indeed the formation of less numerous, less dense and/or narrower filaments. Consistently, both $I_{RESET}$ and $P_{RESET}$ of the subsequent reset cycle decrease with the increase of low resistance (LRS) $R_{SET}$ as illustrated in FIGS. 15 and 16, respectively. This inverse relationship between the value $R_{SET}$ of low resistance state and the reset power $P_{RESET}$ confirms the direct control on the number and width of the conductive filaments formed in the oxygen-deficient NiO layer 3 when setting this NiO layer 3 to a low resistive state $R_{SET}$. These results indicate the possibility of multilevel switching, controlled by the use of different compliance current $I_{COMP}$ values. As the amount of created filaments can be determined by selecting the compliance current at set switching thereby resulting in a gradual change in the value of the low resistance state, multilevel switching is indeed possible.

An advantage of using the compliance current $I_{COMP}$ of a programming device, in the particular embodiment of the SPA, is that the intermediate resistive states obtained in a set cycle do not need to be first programmed to the most conductive set state before resetting.

Figure 17:
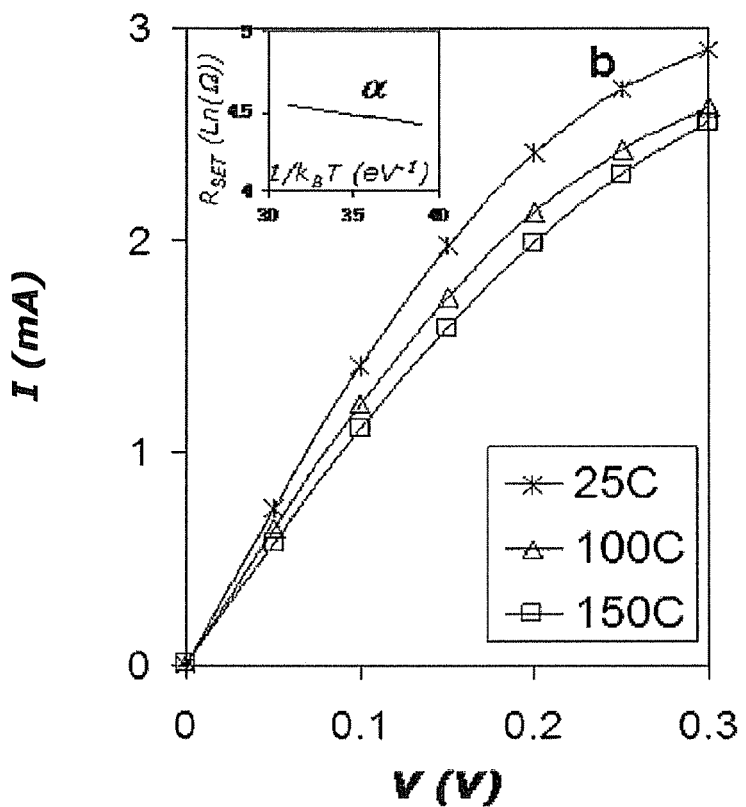
FIG. 17 and FIG. 18 show current I (A)-voltage V (V) characteristics of the LRS state $R_{SET}$ of a memory cell according to the first aspect, recorded at different temperatures obtained using high set power $P_{SET}$ to obtain low $R_{SET}$ and low set power $P_{SET}$ to obtain high $R_{SET}$, respectively.
Figure 18:
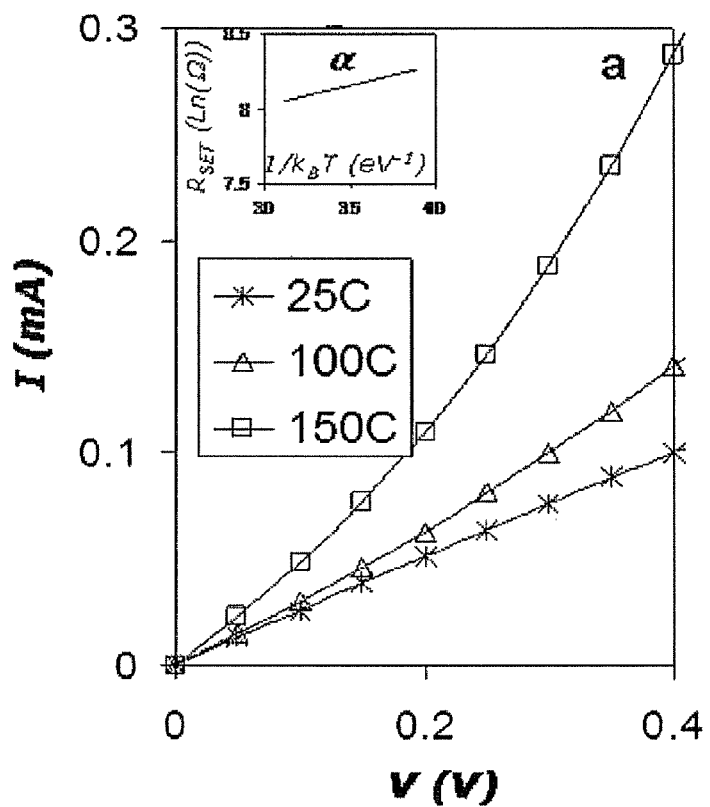

FIG. 17 and FIG. 18 show current I-voltage V sweeps measured at different temperatures for a NiO layer set to low resistance states obtained with respectively a compliance current of $I_{COMP}$>1 mA and with $I_{COMP}$<1 mA. The high-power low resistive state shown in FIG. 17 shows a metallic-like increase of the resistance $R_{SET}$ with the temperature as observed in the prior art. With metallic-like behavior is meant that the resistance increases with temperature. However, the low-power low resistive state shown in FIG. 18 exhibits a thermally activated conduction, probably involving carrier transport between oxygen vacancy defects along filament-chains having higher density of vacancies, whereby the value of the low-power low resistive state decreases with increasing temperature.

The value $R_{SET}$ of the low-power low resistive state is higher than the value $R_{SET}$ of the high-power low resistive state.

The high resistive state of the sample shown in FIG. 17 also increases with increasing temperature.

To gain some insight into the physical nature of the filaments, the temperature dependence of the conduction of the LRS state, depending on the LRS resistance $R_{SET}$ has been studied. FIG. 17 shows the decrease of the conduction at higher temperature for low LRS resistance $R_{SET}$ (corresponding to high switching current/power), indicating a metallic behaviour of the filaments. On the other hand FIG. 18 shows an increase of the current with the temperature for high LRS resistance $R_{SET}$ (corresponding to low switching current/power). This latter effect was associated to the strong influence of the semiconducting behaviour of the NiO matrix outside the filaments on the decrease of the LRS resistance $R_{SET}$ with the temperature. This effect may be observed in case of very large nickel oxide cells for which the resistance ratio between LRS and HRS state is low, in other words when the parallel resistance constituted by the NiO matrix of the nickel oxide layer 3 affects the overall cell resistance when the temperature increases. However this effect did not hold for the memory cells according to the embodiments, because the resistance of the HRS state was observed to be more than 2 decades higher than the LRS resistance in the temperature range up to 150° C. Moreover an increase of the HRS resistance with the increase of the temperature was observed, which was associated with a relaxation mechanism. To summarize, these findings indicate that the increase of the LRS resistance $R_{SET}$ with the temperature is due to the filaments, and thus it implies that the filaments themselves are of semi-conducting type.

Figure 19:
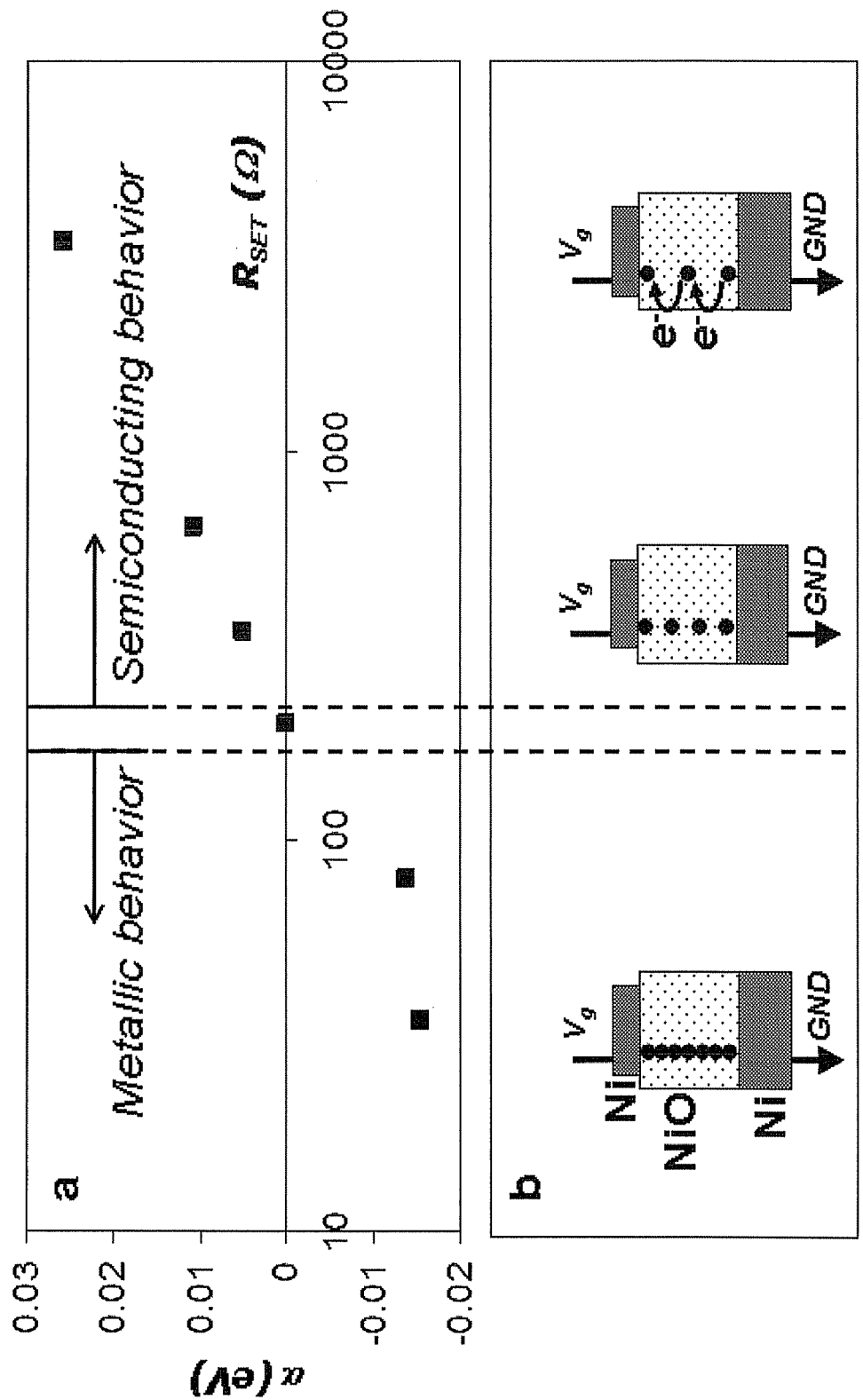
FIG. 19 shows (a) the dependence of the activation energy on the LRS resistance $R_{SET}$ when going from metallic behaviour to semiconducting behaviour and (b) associated amounts of oxygen vacancies.

FIG. 19, in its top part (a), shows the influence of the activation energy α, extracted from I-V characteristics as shown in FIGS. 17 and 18, on LRS resistance $R_{SET}$. The activation energy is obtained by plotting the cell resistance (as measured in the set state at different temperatures) as a function of 1/kT (Arrhenius extraction). One can see the gradual transition between the metallic (left) and semiconducting (right) behaviour of the filaments depending on LRS resistance $R_{SET}$. The transition is observed for $R_{SET}$~200Ω, which is obtained for $I_{COMP}$ ~800 μA. Note that the Arrhenius plots in the insets of FIG. 17 are not linear in broader temperature ranges extended above 100° C., however the purpose of this extraction was only qualitative. The semiconducting nature of the filament may be associated again with the strong oxygen deficiency of the NiO element wherein the conduction probably involves carrier transport between oxygen vacancy defects along filament chains having higher density of vacancies as illustrated by the top part of FIG. 19. Higher set powers would increase the density of vacancies along a filament up to the point it becomes metallic.

The semiconducting nature of the filaments may be associated again to the strong oxygen deficiency of the NiO element wherein the conduction probably involves carrier transport between oxygen vacancy defects along filament-chains having higher density of vacancies. The bottom part of FIG. 19 shows sketches of the amounts of oxygen vacancies created during set switching and affecting the conduction mechanism. Higher set powers would increase the density of vacancies along a filament up to the point it becomes metallic.

More generally, this low-power switching process may retard the degradation of the cell cycle after cycle as compared to deformations or formation of Ni filaments associated with electro-migration processes during high-power set switching. These switching-related degradations related to metal electro-migration effects during high-power set switching might be reduced using lower set power. Preliminary endurance tests up to 100 I-V set/reset cycles without failure were observed for low-power switching.

Figure 20:
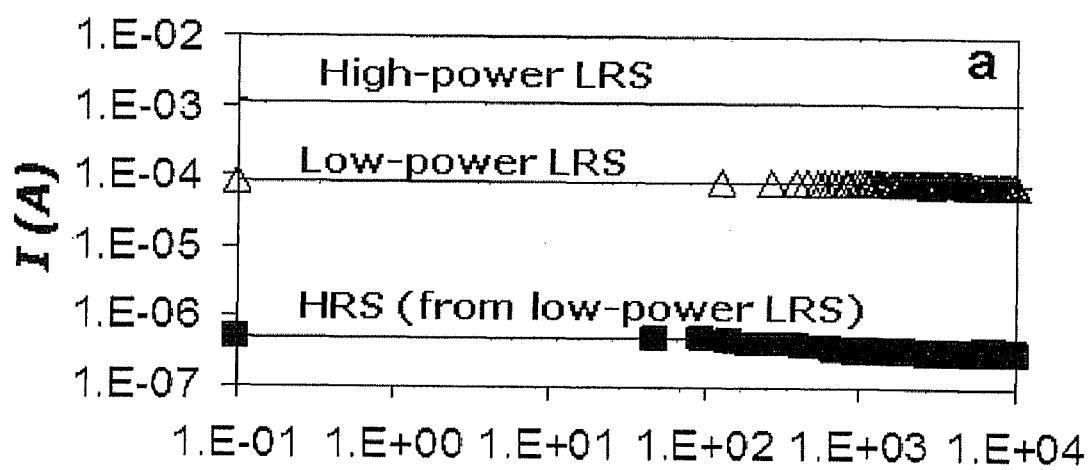
FIG. 20 shows the retention behaviour of a memory cell according to the first aspect for a read voltage of 0.1V at 150° C.

Finally, the low-power switching, associated with the assumed formation/erasure of few and tiny filaments, also questions the stability of this LRS state. This point is particularly important to address, bearing in mind that the LRS state is reported to be more prone to retention loss at high temperature because of the thermal activation of the reset switching mechanism. Therefore, retention tests of the low-power LRS, high-power LRS, and HRS states up to 150° C. were carried out. The cells were programmed in the respective states at room temperature, then they were raised at the test temperature whereby the resistance was read as a function of time using $V_{READ}$=0.1 or 0.3 V. FIG. 20 shows the main results of this investigation. All states showed strong stability. Regarding the low-power LRS state, excellent behaviour was obtained for $V_{READ}$=0.1 V. For $V_{READ}$=0.3 V (not illustrated in FIG. 20) a small resistance jump was observed after ~2000 sec. at 150° C., however keeping a memory window of ~2 decades after $10^4$ sec. at 150° C., indicating good immunity of the cell to read disturbs (bearing in mind that the reset voltage observed for low-power set state is in the range 0.4-0.5 V).

Figure 21:
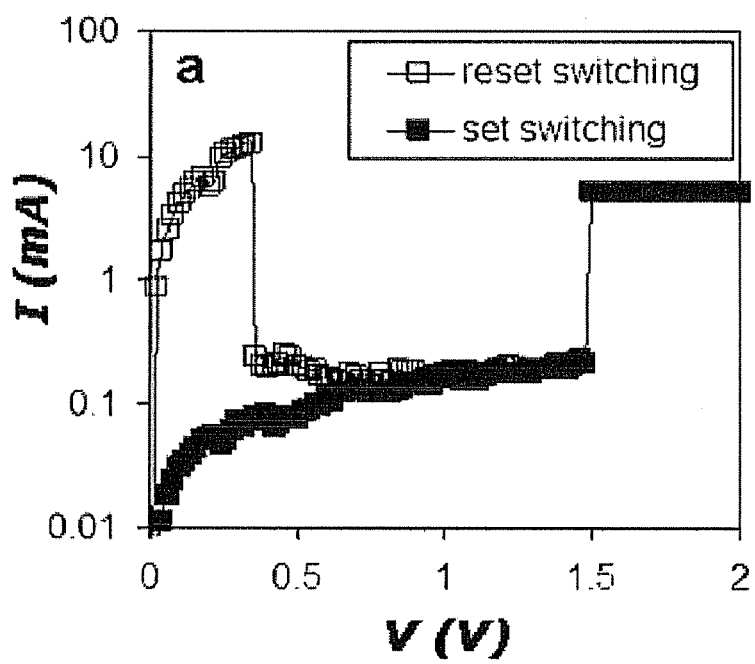
FIG. 21 shows current I (A)-voltage V (V) set/reset switching curves for a Ni/NiO/TiN memory cell in a single 80 nm wide contact hole.
Figure 22:
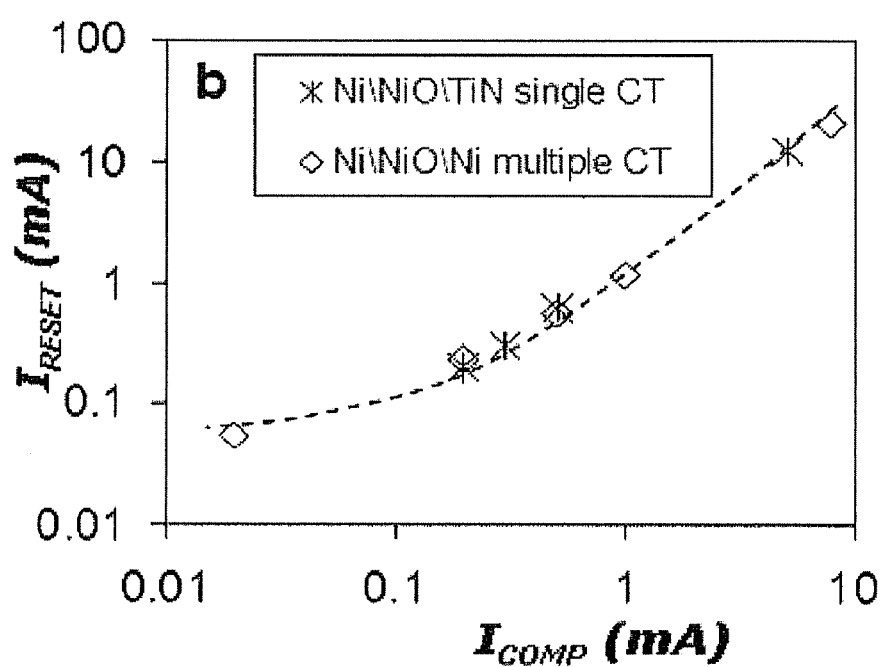
FIG. 22 illustrates the decrease of $I_{RESET}$ with $I_{COMP}$ for Ni/NiO/Ni multiple contact memory cell and Ni/NiO/TiN single contact memory cell.

FIG. 21 shows typical set/reset sweeps obtained using high set power for a single contact memory cell whereby a single contact is formed to expose the Ni 11 to form a NiO layer 3 in the contact opening 13. As a top electrode 4 TiN is used. The high current level reached before reset switching indicates that wide filaments may be programmed within a single and narrow contact, and confirms that low-power switching is more related to the programming conditions than to the cell size. In agreement, low-power switching was also possible in these Ni/NiO/TiN single-contact cells. FIG. 22 confirms the possibility to decrease drastically $I_{RESET}$ for low set power also for single-contact cells, thus showing the scaling potential of NiO cells in single contacts. Both multiple contact Ni/NiO/Ni memory cells and single contact Ni/NiO/TiN memory cells show the same dependency of $I_{RESET}$ on $I_{COMP}$.

What is claimed is:

1. A unipolar resistive-switching non-volatile memory element, comprising:
   a metal-oxide layer sandwiched between a top electrode and a bottom electrode, the resistivity of the metal-oxide layer being switchable between a low resistive state (LRS) and a high resistive state (HRS),
   wherein the metal oxide layer has a substoichiometric oxygen-to-metal ratio selected to have a forming voltage $V_{forming}$, for bringing the memory element into an initial low resistive state, of 1 V or less.

2. The memory element according to claim 1, wherein the metal-oxide layer is sandwiched between and in contact with the top electrode and the bottom electrode.

3. The memory element according to claim 1, wherein the metal oxide layer is substantially isotropic.

4. The memory element according to claim 1, wherein a reset current $I_{reset}$, required for setting the memory element to a high resistive state, is less than 100 uA.

5. The memory element according to claim 1, wherein the resistivity of the low resistance state LRS is selectable by selecting a compliance current $I_{comp}$ applied when bringing the memory element into the low resistance state LRS.

6. The memory element according to claim 1, wherein the low resistive state is a semiconducting low resistive state by semiconducting filaments in the resistive switching metal oxide layer.

7. The memory element according to claim 1, wherein the metal oxide layer is a binary metal oxide layer.

8. The memory element according to claim 7, wherein the binary metal oxide layer is a nickel oxide layer with an oxygen-to-nickel ratio between 0 and 0.85.

9. The memory element according to claim 8, wherein the binary metal oxide layer is a nickel oxide layer with an oxygen-to-nickel ratio between 0.6 and 0.85.

10. The memory element according to claim 7, wherein the bottom electrode comprises nickel and wherein the top electrode comprises nickel.

11. The memory element according to claim 10, wherein the top electrode consists of nickel.

12. A method for multi-level programming of a unipolar resistive-switching non-volatile memory element, the memory element comprising a metal-oxide layer sandwiched between a top electrode and a bottom electrode, the resistivity of the metal-oxide layer being switchable between a low resistive state (LRS) and a high resistive state (HRS), whereby the resistive switching metal oxide layer has a substoichiometric oxygen-to-metal ratio selected to have a forming voltage $V_{forming}$, for bringing the memory element into an initial low resistive state, of 1 V or less, the method comprising:
   selecting low resistance state LRS,
   selecting a value of a set power, for being applied during a set voltage switching, in view of the selected low resistance state, and
   switching the memory element into the low resistance state LRS by applying a predetermined set voltage $V_{SET}$.

13. The method of claim 12, wherein selecting a value for the set power comprises selecting a value of a compliance current $I_{COMP}$ for being applied during the set voltage switching.

14. The method according to claim 13, wherein selecting a value of the set power comprises selecting a value of the set voltage as 1 V or less, and selecting a value of the compliance current comprises selecting a value in the range of 0.1 uA to 1 mA.

* * * * *